United States Patent [19]

Short et al.

[11] Patent Number: 4,554,059

[45] Date of Patent: Nov. 19, 1985

[54] ELECTROCHEMICAL DIELECTRIC ISOLATION TECHNIQUE

[75] Inventors: John P. Short, Indian Harbour Beach; Craig J. McLachlan, Melbourne Beach; Charles Messmer, Palm Bay; Paul S. Reinecke, Indialantic, all of Fla.

[73] Assignee: Harris Corporation, Melbourne, Fla.

[21] Appl. No.: 678,075

[22] Filed: Dec. 4, 1984

Related U.S. Application Data

[63] Continuation of Ser. No. 548,631, Nov. 4, 1983, abandoned.

[51] Int. Cl.⁴ ............................................. C25F 3/12
[52] U.S. Cl. ............................... 204/129.3; 204/129.6
[58] Field of Search ....................... 204/129.3, 129.6

[56] References Cited

U.S. PATENT DOCUMENTS

| | | | |
|---|---|---|---|
| 3,536,600 | 10/1970 | Van Dijk et al. | 204/129.3 |
| 3,575,740 | 4/1971 | Castrucci et al. | 148/175 |
| 3,640,807 | 2/1972 | Van Dijk | 204/129.3 |
| 3,642,593 | 2/1972 | Meek | 204/129.3 |
| 3,661,741 | 5/1972 | Meek | 204/129.3 X |
| 3,721,588 | 3/1973 | Hays | 156/628 |
| 3,776,788 | 12/1973 | Henker | 204/129.3 X |
| 3,902,979 | 9/1975 | Thomas | 204/129.3 |
| 4,050,979 | 9/1977 | Smeltzer et al. | 156/647 |
| 4,056,415 | 11/1977 | Cook, Jr. et al. | 204/129.3 X |
| 4,166,782 | 9/1979 | Collins et al. | 204/129.3 |
| 4,380,865 | 4/1983 | Frye et al. | 204/129.3 X |

Primary Examiner—Donald R. Valentine
Attorney, Agent, or Firm—Barnes & Thornburg

[57] ABSTRACT

Plane indicating moats are formed extending through an epitaxial layer into a substrate simultaneous with the formation of the isolation moats which terminate within the epitaxial layer. The substrate is ground to a predetermined thickness after formation of the dielectric isolation and support structure. The composite structure is inserted in an etchant with conditions set to electrochemically etch only the substrate. The exposed plane indicating moats are used as a reference for a final polishing step.

22 Claims, 18 Drawing Figures

ELECTROCHEMICAL DIELECTRIC ISOLATION TECHNIQUE

This is a continuation of application Ser. No. 548,631, filed Nov. 4, 1983, now abandoned.

BACKGROUND AND SUMMARY OF THE INVENTION

The present invention relates generally to dielectrically isolated integrated circuits and more specifically to an improved dielectrically isolated integrated circuit formed by use of electrochemical etching.

Dielectrically isolated integrated circuits generally include a plurality of islands separated from a support on its side and bottom by a dielectric isolation. One of the earlier processes for forming these dielectric isolated islands included an anisotropically etching of a first surface of a substrate to form moats, covering the first surface and the moats with a dielectric isolation layer, followed by forming a support layer thereon. The structure is illustrated in FIG. 1 as having the original substrate 10 with dielectric isolation layer 12 and Support layer 14. A second surface 16 is mechanically removed down to a line 18 so as to expose the support layer 14 thereby forming dielectrically isolated islands. Devices are built in the surface along line 18. Since the second surface 16 is used as a reference plane for the grinding and polishing, any mismatch between surface 16 and the original surface 20 in which the moats are formed will result in the top surface 18 being non-parallel to the bottom surface 20. Since the original substrate 10 must be thick enough to be handled after etching without breaking and subsequently removed by grinding, control of the final thickness and parallelism of surfaces is reduced by grinding tolerances. Thus, the depth of the islands formed must be increased to increase the tolerance to compensate for any mismatching planarity. This unnecessarily increases the surface area of the islands and therefore adversely affects the density on the chip. Since the starting material 10 is also the regions which form the island, different starting resistivity materials must be used depending upon the circuit requirement.

Another method of forming dielectric isolation regions is electrochemical etching. This method is illustrated in FIG. 2 and includes epitaxially forming a second layer 22 on a first layer 24 wherein the first layer 24 has a lower resistivity than the second layer 22. The process is continued as in FIG. 1 wherein moats are anisotropically formed in the epitaxial layer 22 terminating within the second layer 22 followed by formation of a dielectric isolation layer 26 and a support layer 28. The composite structure is then placed in an etching bath and layer 24 is removed by electrochemical etching. This removes the layer 24 down to the interface 30 between the first and second layers 24 and 22. Layer 22 is then mechanically removed down to the dash line 32 exposing portions of the support layer 28 to form dielectrically isolated regions. Devices are formed in the surface 32. The electrochemical etch of FIG. 2 has been found to eliminate the errors produced by the mechanical removal of FIG. 1 since a majority of the material is removed by etching down to a substantially well defined surface 30 and then a small area between 30 and 32 is removed by mechanical means. In FIG. 1, the substantially thick layer 10 is reduced from surface 16 down to 18 by mechanical means. Also, since layer 22 is epitaxially grown, the parallel relationship between planes 30 and 34 of FIG. 2 is substantially greater than that between 16 and 20 of FIG. 1.

Electrochemical etching also has its problems. As noted in U.S. Pat. No. 3,536,600, a tapering effect can be produced and must be corrected. Similarly, because of the subsequent high temperature processing steps, impurities from layer 24 diffuse into layer 22 and consequently the interface layer 30 is not well defined. This induces additional errors in the removal of layer 24 to form a surface 30 which will be mechanically removed. The depth of the final resulting structure between planes 32 and 34 is increased by 10% to account for epitaxial growth errors. By increasing the depth, the lateral surface errors also increase and thereby reduces packing density. Thus, there exists the need for a method of forming dielectrically isolated islands wherein a final resulting surface is as parallel as possible to the bottom of the islands and therefore minimizing the depth error or tolerance which will substantially increase density.

An object of the present invention is to provide a method for fabricating dielectrically isolated regions of increased density.

Another object of the present invention is to provide a method of forming dielectrically isolated islands having increased depth accuracy.

Still another object of the present invention is to provide a method of fabricating dielectrically isolated regions which is capable of tailoring the resulting island resistivity and type while starting with a common substrate.

These and other objects of the present invention are attained by providing an indicator of a plane after electrochemical etching which is parallel to the plane of the surface in which the moats are etched. This allows electrochemical etching to be used with mechanical removal down to the final required depth resulting in substantial planarity of the top and bottom of the dielectrically isolated islands. The plane indicating moats are formed at the same time as the dielectric isolation moats which extend through the epitaxial layer and into the layer which is removed by electrochemical etching. By using an anisotropic etch, the depths of the two moats may be controlled within very close tolerances. The surface in which the moats are etched may be exposed to an introduction of impurities to form buried regions at the surface or to change the conductivity type or impurity concentration of the total resulting dielectrically isolated regions. The surface may also be etched and filled by epitaxial deposition of material of opposite conductivity type or increased impurity concentration.

Other objects, advantages and novel features of the invention will become apparent from the following detailed description of the invention when considered in conjunction with the accompanying drawings.

DETAILED DESCRIPTION OF THE DRAWINGS

Figure 3:
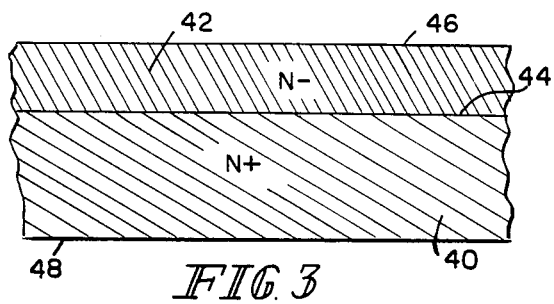
FIGS. 3 through 11 are cross-sectional views of a wafer illustrating the method of fabrication incorporating the principles of the present invention.

The process begins with the formation of an epitaxial layer 42 on a substrate 40 having an interface 44 therebetween. The original substrate 40 is a relatively high doped material, for example, antimony doped to have a resistance less than 0.05 ohm centimeters and having a [100] oriented parallel faces 44 and 48 parallel to approximately plus or minus two microns. The control of the parallelism is not as critical as in prior dielectric isolation processes as will be evident from the following description. The epitaxial layer 42 has a resistivity in the range of 0.1 to 100 ohm centimeters depending upon the desired parameters of the resulting structure. The important point being that the difference of resistivity of the substrate 40 and layer 42 should be at least one half an order of magnitude. This is important due to the electrochemical etching step to be described below. The epitaxial layer 42 is grown to have a thickness in the range of 7 to 75 microns depending upon the desired island depth. The resulting structure is illustrated in FIG. 3.

Figure 4:
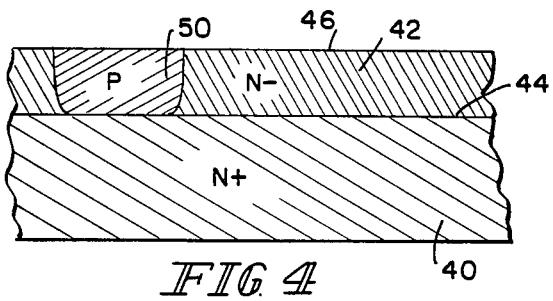

If an integrated circuit is required having islands of two different conductivity types, a mask layer is formed on exposed surface 46 of the epitaxial layer 42 having openings for the second type island locations. Opposite conductivity type impurities, for example, P type dopants of, for example, boron or aluminum are then introduced and diffused down to a depth approaching the depth of the epitaxial layer 42. The resulting structure is illustrated in FIG. 4 wherein a P type impurity region 50 is formed in the epitaxial layer 42. Also, a masking step may be performed to introduce N type impurities in the N— epitaxial layer 42 to form a lower resistivity region than the epitaxial layer 42 but not as low as the N+ substrate 40 (not illustrated). This allows an integrated circuit having both analog devices formed in high resistivity region and digital devices are formed in the low resistivity device islands.

Figure 5:
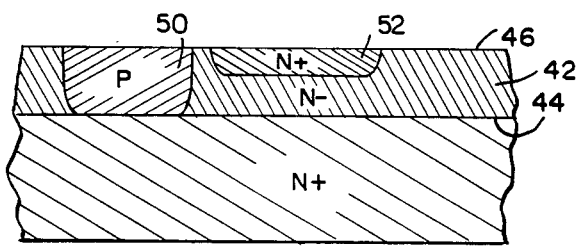

In either case, the masking layer is removed and a new masking layer is formed by, for example, oxidation and patterned to form high impurity concentration buried layers. N type impurities, for example, are introduced and diffused to the required sheet resistivity and penetration. This is illustrated in FIG. 5 as N+ region 52. It should be noted that if only single conductivity type isolated regions are required, the formation of the P region 50 may be eliminated and the surface 46 may be non-selectively subjected to an N+ implant and diffusion. This would result in all the dielectrically isolated islands having a buried N+ layer. It should also be noted that a buried layer may be formed in P region by introducing P+ impurities through a separate masking step using a boron deposition or implant and diffusion cycle.

Figure 6:
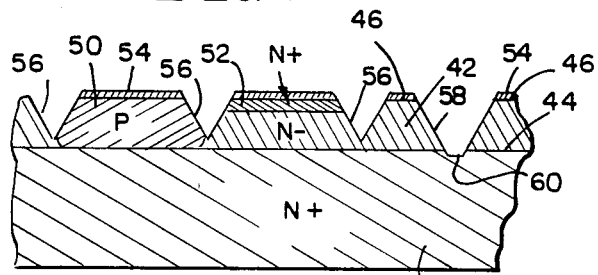

A mask layer 54 is formed on the surface 46 of the epitaxial layer 42 and patterned for openings to form the moats for the isolation walls as well as the scribe lines. Moats are anisotropically etched through the pattern using, for example, a water, alcohol, potassium hydroxide solution. Moats between the dielectrically isolated islands are allowed to V-out and the scribe line moats which encircle the eventually to be formed circuit chips are allowed to etch deeper. As is well known, the depth of the V is a function of the cross-section of the aperture. As illustrated in FIG. 6, the island moats terminate within the epitaxial layer 42 while the scribe line moats 58 extend through the epitaxial layer and into the original starting material 40.

Although the scribe line moats 58 are shown not to V-out, they may be allowed to V-out if desired. It is preferential that they do not V-out and form a flat surface 60 at the bottom thereof. By the crystallography, the flat surface 60 is parallel to the original surface 46 of the epitaxial layer 42. As will be explained more fully with reference to FIGS. 12, 13 and 14, the moats 56 terminate a sufficient distance from interface 44 such that the electrochemical etching will not reach the minimum island V-out. As discussed previously, N type impurities from substrate 40 diffuse into epitaxial layer 42 thereby moving the interface of impurities 44 from the original epitaxial interface. Thus, the deeper moats 58 need not extend into the original substrate 40, but only past the lower impurity concentration portion of epitaxial layer 42.

Figure 7:
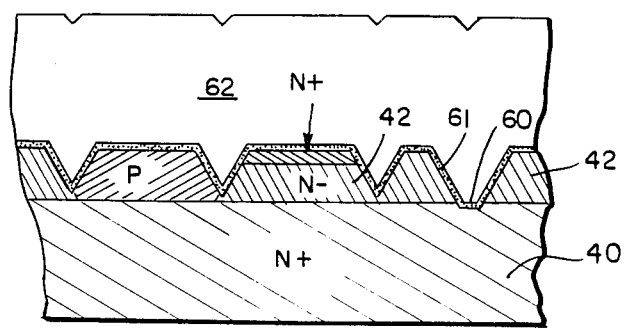

The masking layer 54 is removed and the surface of the moats 56 and 58 and surface 46 of the epitaxial layer are clean and a dielectric layer 61 is formed thereon. As is well known, this layer may be an oxide layer formed by thermal oxidation or may be a deposited layer. Similarly, this dielectric layer may be silicon nitride, or an oxide-nitride combination. A polycrystalline silicon layer is then deposited to a thickness applicable to providing a final, specified, dielectrically isolated slice thickness. The polycrystalline layer forms a support 62 illustrated in FIG. 7. The exposed polycrystalline surface is ground to thicknesses compatible to final dielectric isolation wafer thickness and to remove the top surface grooves caused by the deposition in the moat pattern. While the planarity of this surface and the parallelism to the surface of the original substrate are important, namely to be within the plus or minus two micron range, they are not nearly as critical as in the prior dielectric isolation material processes.

Figure 8:
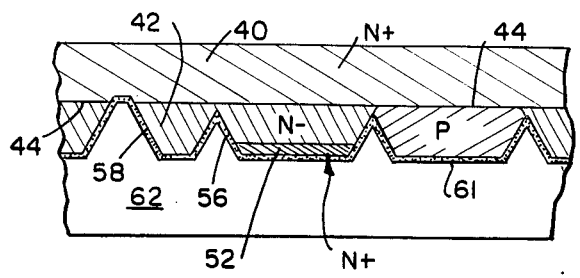

The slice is inverted and the N+ substrate region 40 is mechanically ground to approximately 35 micron thickness from the epitaxial interface 44. This grinding step is also much less critical than the corresponding grind or lap or etch using prior dielectric isolation material processes. The resulting structure is illustrated in FIG. 8. As will be discussed below, the thickness of the N+ layer 40 must be sufficient depending upon its resistivity, electric potential, and the etching bath to support electrochemical etching.

The composite structure of FIG. 8 is moved in a dilute bath of hydrofluoric acid, less than approximately 10% by volume, while a current is applied through the N+ layer 40. The slice may be moved relative to the bath or the bath may be moved relative to the slice to provide a narrow etching interface. Contact electrodes are on the N+ layer and a platinum screen suspended parallel to the slice in the hydrofluoric etchant. As the level of etchant moves relative to the slice, the N+ layer is etched away until the low-conductive, higher resistive epitaxial layer 42 is exposed or the total current is pinched off by the encircling oxide scribe line moats 58. As will be discussed below, the best control of the final island dimensions is achieved by using the pinch-off mechanism since it reduces the criticality of the epitaxial thickness variations on the final island dimension control.

Figure 9:
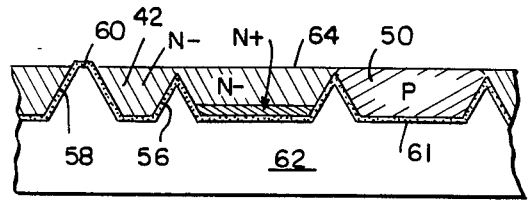
Figure 10:
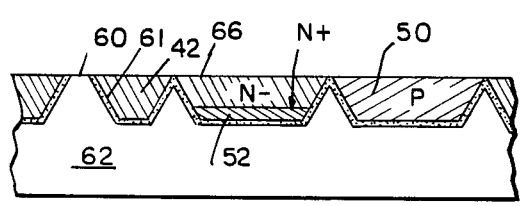

The resulting structure is illustrated in FIG. 9 and shows the bottom portion 60 of the moat 58 exposed and a surface 64 of the epitaxial layer 42 exposed. The tips of the moats 56 are not exposed. A thin polish is performed to remove the updiffused region from the heavily doped substrate 40 which has been removed, to remove the etch stain, and to isolate the island regions to a specific thickness depth. The depth is sufficient such that the polycrystalline layer 62 is exposed at a new surface 66 as illustrated in FIG. 10. The exposed portions of the scribe line moat 60 provided a plane parallel to the bottom of the moat 46. Thus, the mechanical removal of the portions of the epitaxial layer 42 will be more parallel to the bottom of the moat than the prior art methods. Since the variation between the top surface 66 and the bottom surface 46 of the islands is reduced, the additional tolerance depth provided in the islands is reduced which reduces the lateral area of the islands. Thus, packing density is substantially increased over prior art devices. In the present process, the critical control parameter which limits tolerance variation of the final island dimension is the scribe line moat depth. With only this variation plus the minimal tolerance due to the thin polish, the final island thicknesses can then be controlled to within plus or minus one micron.

Figure 11:
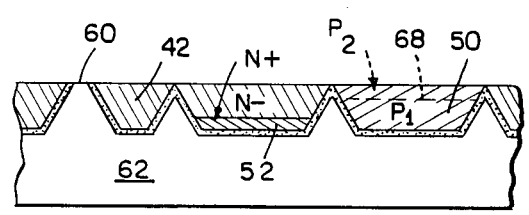

To enhance the quality of the P island 50, it may be necessary to selectively diffuse boron into the P island surface. This prevents any channeling in the P island due to low dopant concentration since the original diffusion was a backside diffusion. This diffusion is obviously through a mask layer with the resulting structure illustrated in FIG. 11 as having a surface P2 type impurity concentration by the dotted line 68. This added diffusion also insures that no N type layer is in the top of the P islands if the back diffusion is not deep enough. This also can be used to reduce the high temperature heating time for the backside diffusion which will also minimize the diffusion of the N+ impurities from the original substrate 40 into the epitaxial region 42. This diffusion has a serious effect on the interface 44 which is critical relative to the electrochemical etching step.

Figure 13:
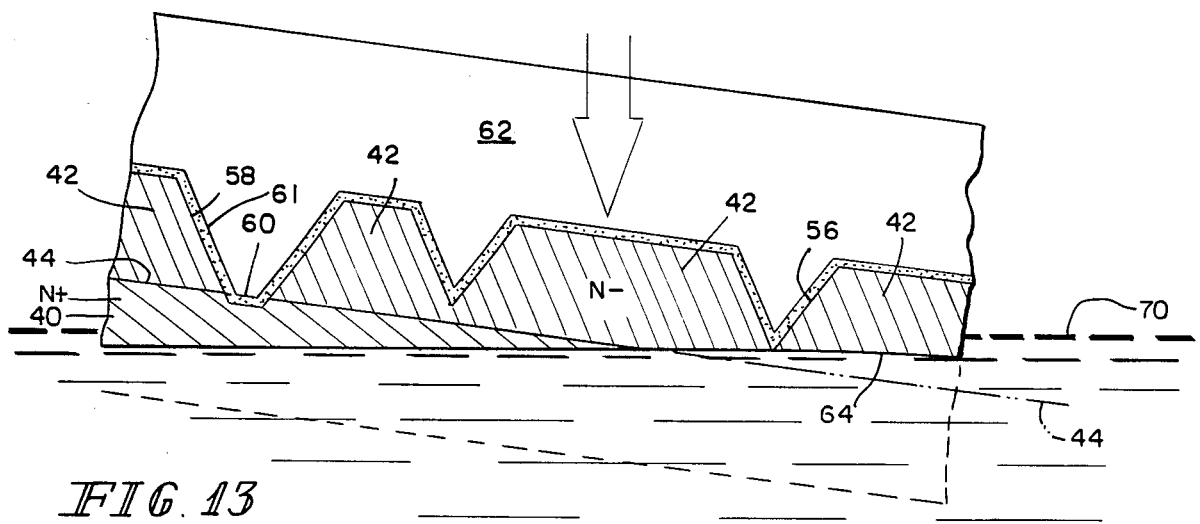
Figure 14:
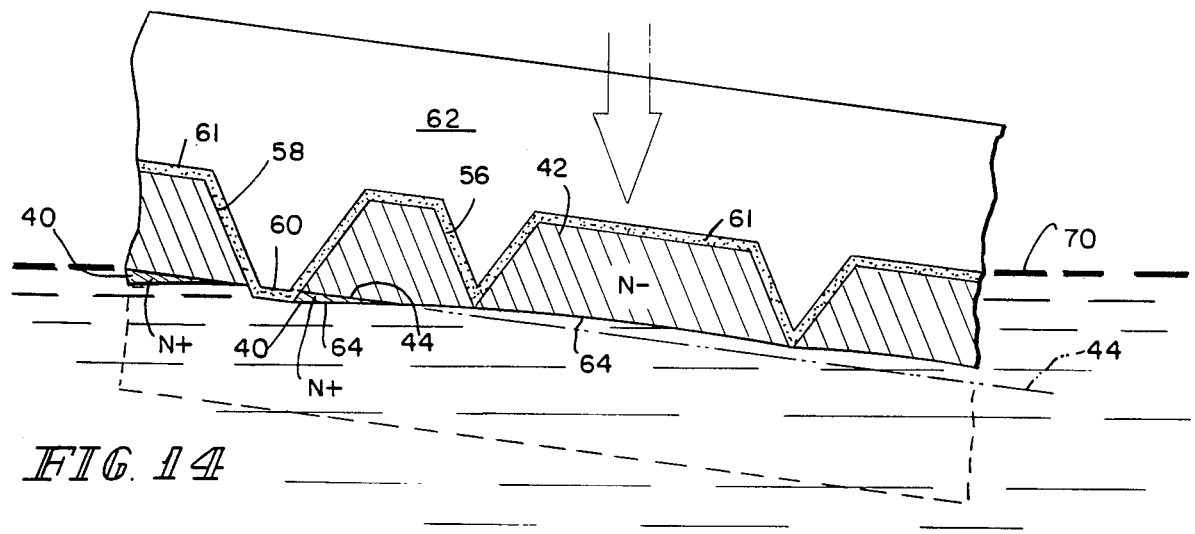

A detailed explanation of the electrochemical etch process of the present invention will be described in reference to FIGS. 12, 13 and 14. The composite structure of FIG. 8 is lowered into the electrochemical bath at a slow enough rate such that electrochemical etching will terminate before all of the first layer 40 is etched. The termination of the electrochemical etching is due to pinch-off phenomenon wherein the resistance of the N+ layer 40 is reduced below that required to sustain the electrochemical etching process. As discussed previously, the interface 44 between the N+ layer 40 and the N− epitaxial layer 42 may not necessarily be a straight line or the original interface of the epitaxial growth since additional heat process steps will cause impurities from the highly doped N+ region 40 to diffuse into the lower N− region 42.

Figure 12:
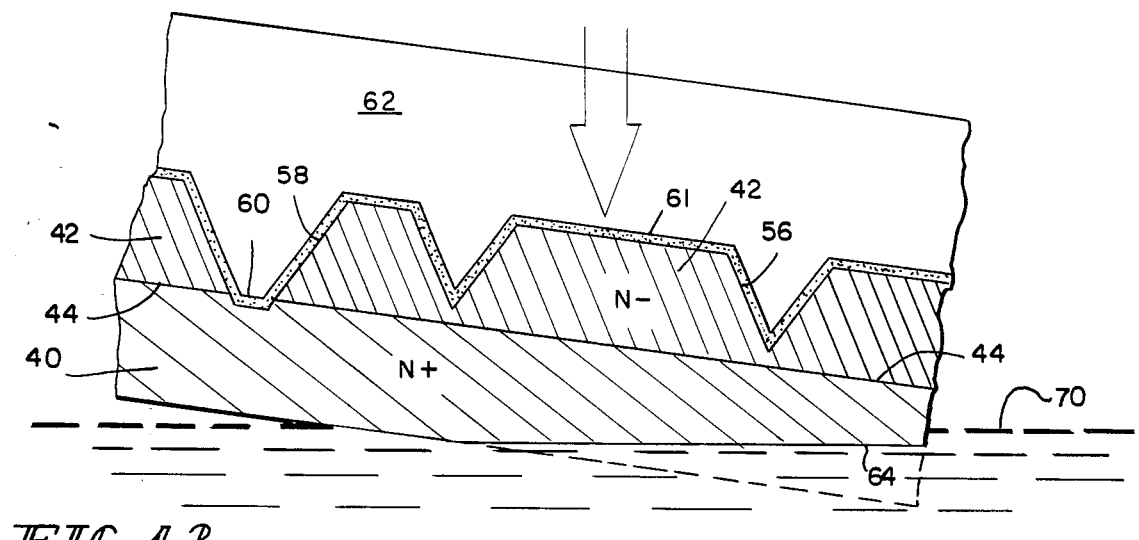
FIGS. 12, 13 and 14 are cross-sectional views illustrating the electrochemical etching step.

To enhance the pinch-off technique, the composite structure of FIG. 8 is inserted into the electrochemical bath 70 at a small angle as illustrated in FIG. 12. Preferably, this angle is 20° or less. The insertion motion is vertical. As illustrated in FIG. 12, the first N+ layer 40 is etched substantially along the surface of the bath 70 and at a very small angle relative to the interface line 44 between the N+ layer 40 and the N− epitaxial layer 42. The phantom line in the figures indicates the original interface prior art etching of layer 40.

As the composite structure is further inserted into the fluid 70, the etching continues. As illustrated in FIG. 13, at the far right corner, the etching surface 64 extends into the N− layer 42 below the interface 44. Thus, the portion between the scribe lines 60 tends to dish out with the electrochemical etching surface not being planar. At the point illustrated in FIG. 13, the portion of the layer 40 in the fluid 70 has been reduced thereby increasing the resistance thereof to a value which terminates the electrochemical etching. The net result, as illustrated in FIG. 14, is that a portion of the layer 40 remains as a shadow. Thus, not only has the portion of the N− epitaxial region 42 been etched out and dished, but portions of the original layer 40 remain due to the pinch-off of the current flow.

As an example of the operating parameters of the present system, an N+ region 40 having a resistance below 0.02 ohm centimeters and a thickness of 35 microns was placed in a dilute solution of less than 10% of hydrofluoric acid in water. The N+ layer 40 and a platinum screen suspended in the etchant were biased to a voltage of 10 volts and the composite structure was inserted at an angle of 15 and lowered into the bath at a rate of 0.5 inches per hour.

Since the lowest point 60 of the scribe line moats are totally exposed and used as a reference point to define a grinding and polishing plane, the extra material or portions of the original layer 40 remaining behind are not a serious problem. A more serious problem is the dishing out or etching of the N− layer 42. Not only should there be enough of the layer 42 between the interface 44 and the bottom of the moats 56 such that the dish out etching does not go within the area defined by the bottom of the moats 56, but is has been found that the deep moats 58 should be placed no greater than 1000 microns apart. This minimizes the dishing out effect for the angle of repose described above.

Figure 1:
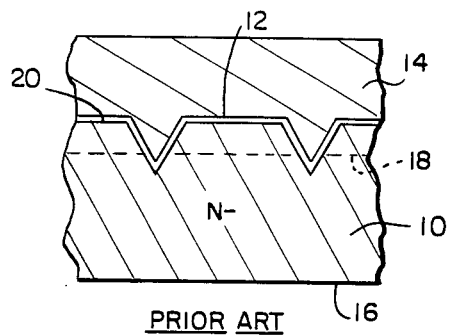
FIG. 1 is a cross-sectional view of a wafer at a stage of fabrication using mechanical removal of the prior art.
Figure 2:
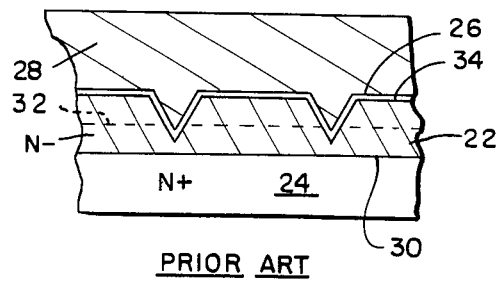
FIG. 2 is a cross-sectional view of a wafer using electromechanical removal of the prior art.
Figure 15:
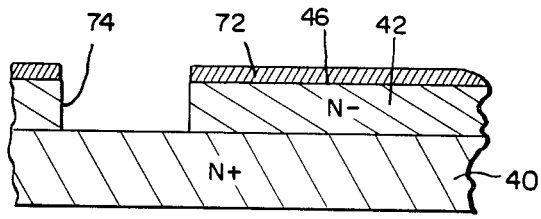
FIGS. 15, 16 and 17 are cross-sectional views illustrating a wafer during a modified step of the process of FIGS. 3-11.
Figure 16:
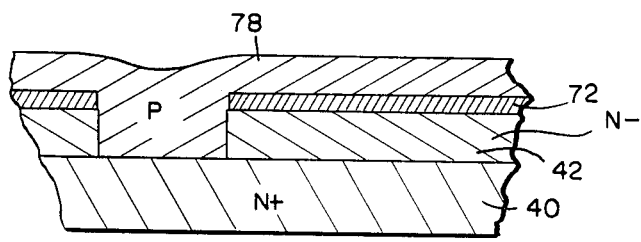
Figure 17:
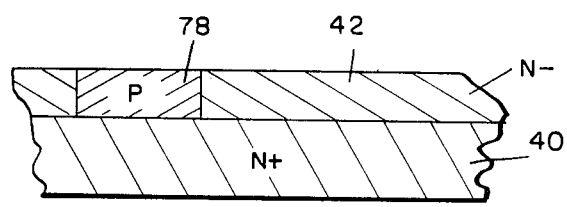
Figure 18:
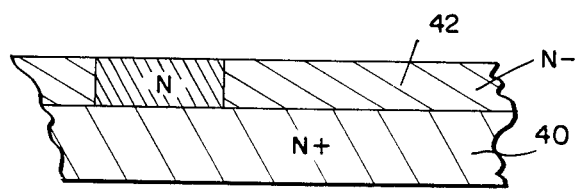
FIG. 18 is a cross-sectional view of a wafer which is a further modification of the method of FIGS. 15-17.

As a further modification of the present process, the P region 50 may be formed by other than diffusion. As illustrated in FIG. 15, a masking layer 72 is provided on the surface 46 of the epitaxial layer 42 and a window is opened therein and used as an etching mask to etch down to the N+ layer 40. The resulting opening 74 is then filled with, for example, P type material 78 by epitaxial growth. The P type material and the mask layer 72 are removed by well known processes to result in the planar structure illustrated in FIG. 17. Alternatively, N type material may be epitaxially grown having an impurity concentration greater than the epitaxial layer 42 but less than the N+ layer 40. This allows the electrochemical etching to differentiate between the two layers.

From the preceding description of the preferred embodiment, it is evident that the objects of the invention are attained an although the invention has been described and illustrated in detail, it is to be clearly understood that the same is by way of illustration and example only and is not to be taken by way of limitation. Although the present invention has been described for epitaxially forming an N− substrate on an N+ starting material, a P type epitaxial layer may be formed on the N+ starting layer or all the conductivity types may be reversed. The spirit and scope of this invention are to be limited only by the terms of the appended claims.

What is claimed is:

1. A method of fabricating dielectrically isolated islands including:
   forming a second layer of semiconductor material on a first layer of semiconductor material, said first layer having a lower resistivity than said second layer;
   etching said second layer to form first moats extending down from a first surface of said second layer and terminating in said first layer and second moats extending down from said first surface and terminating within said second layer;
   forming a dielectric layer on said first surface of said second layer and said moats;
   forming a support layer on said dielectric layer resulting in a composite structure;
   continuously moving said composite structure into an etchant bath and biasing said first layer and said bath to electrochemically etch said first layer to its interface with said second layer and said dielectric layer of said first moats; and
   polishing said second layer and said dielectric layer down to a plane which exposes said support layer in said first and second moats using exposed portions of said first moats as a reference plane.

2. The method according to claim 1 wherein said second moats are etched to terminate within said second layer a sufficient distance from said first and second layer interface so as not to be exposed by said electrochemical etch step.

3. The method according to claim 1 wherein said first moats are formed to have a depth within and lateral spacing in said first layer to prevent electrochemical etching of said second layer to a depth from said interface below a plane formed by the terminations of said second moats.

4. The method according to claim 1 wherein said moats are formed by an anisotropic etch.

5. The method according to claim 4 wherein said first moat is etched to a depth less than a V-out depth so as to have a flat termination.

6. The method according to claim 1 including removing portion of said first layer to reduce its thickness before electrochemical etching.

7. The method according to claim 1 wherein said second layer is formed by epitaxial deposition.

8. The method according to claim 1 including introducing impurities of the same conductivity type as said second layer into said first surface of said second layer to form regions of reduced resistivity in said second layer before forming said support layer 9. The method according to claim 1 including introducing impurities of a second conductivity type opposite a first conductivity type of said second layer into selective areas of said first surface of said second layer to form regions of said second conductivity type extending from said first surface of said second layer to said interface of said first and second layers before forming said support layer.

10. The method according to claim 9 including introducing impurities of said first conductivity type into selected areas of said first surface of said second layer to form regions of reduced resistivity in said second layer before forming said support layer.

11. The method according to claim 1 including removing portions of said support layer to produce a planar surface.

12. The method according to claim 1 wherein said composite structure is moved into said etchant bath with an exposed surface of said second layer forming an angle of less than 20 degrees with respect to the surface of said etchant bath.

13. The method according to claim 12 wherein said composite structure is moved into said etchant bath with said exposed surface of said second layer at an angle of less than 20 degrees with respect to the surface of said etchant bath.

14. The method according to claim 1 including etching said first surface of said second layer to form a well extending from said first surface to said interface between said first and second layers, filling said well with a semiconductor material having different characteristics than said second layer before forming said support layer.

15. The method according to claim 14 wherein said well filling step includes epitaxial deposition of a semiconductor material having a second conductivity type opposite a first conductivity type of said second layer.

16. The method according to claim 14 wherein said well filling step includes epitaxial deposition of semiconductor material having the same conductivity type as said second layer and a lower resistivity than said second layer and higher than said first layer.

17. The method according to claim 1 wherein said composite structur is moved into said etchant bath slow enough so that the electrochemical etching will terminate before all the first layer is etched.

18. The method according to claim 1 wherein said first moats are formed to have a lateral spacing sufficiently close to prevent etching of said second layer.

19. A method of fabricating dielectrically isolated islands including:
   forming a second layer of semiconductor material on a first layer of semiconductor material, said first layer having a lower resistivity than said second layer;
   etching said second layer to form first moats extending down from a first surface of said second layer to a first depth and terminating in said first layer and to form second moats extending down from said first surface to a second depth less than said first depth;
   forming a dielectric layer on said first surface of said second layer and said moats;
   forming a support layer on said dielectric layer resulting in a composite structure; and
   continuously moving said composite structure into an etchant bath and biasing said first layer and said bath to electrochemically etch said first layer to said dielectric layer of said first moats.

20. The method according to claim 19 including removing said second layer and said dielectric layer down to a plane which exposes said support layer in said first and second moats using exposed portions of said first moats as a reference plane.

21. A method of fabricating dielectrically isolated islands including;
   etching a substrate of semiconductor material to form first moats extending down from a first surface and terminating at a first depth and to form second moats extending down from said first surface and terminating at a second depth less than said first depth;
   forming a dielectric layer on said first surface of said substrate and said moats;
   forming a support layer on said dielectric layer resulting in a composite structure; and continuously moving said composite structure into an etchant bath and biasing said substrate and said bath to electrochemically etch said substrate to said dielectric layer of said first moats.

22. The method according to claim 21 including removing said substrate and said dielectric layer down to a plane which exposes said support layer in said first and second moats using exposed portions of said first moats as a reference plane.

* * * * *